United States Patent [19]
Ham

[11] Patent Number: 6,147,494
[45] Date of Patent: Nov. 14, 2000

[54] MAGNETIC RESONANCE APPARATUS PROVIDED WITH FORCE-OPTIMIZED GRADIENT COILS

[75] Inventor: Cornelis L. G. Ham, Eindhoven, Netherlands

[73] Assignee: U.S. Philips Corporation, New York, N.Y.

[21] Appl. No.: 09/198,934

[22] Filed: Nov. 24, 1998

[30] Foreign Application Priority Data

Nov. 28, 1997 [EP] European Pat. Off. ............... 97203727

[51] Int. Cl.[7] ....................................................... G01V 3/00
[52] U.S. Cl. ........................................... 324/318; 324/319
[58] Field of Search ................................... 324/318, 319, 324/320, 322, 300, 307, 309

[56] References Cited

U.S. PATENT DOCUMENTS

| | | | |
|---|---|---|---|
| 4,585,995 | 4/1986 | Flugan | 324/322 |
| 5,675,255 | 10/1997 | Sellers et al. | 324/318 |
| 5,742,164 | 4/1998 | Roemer et al. | 324/318 |

*Primary Examiner*—Louis Arana
*Attorney, Agent, or Firm*—Dwight H. Renfrew

[57] ABSTRACT

The gradient coil system in a conventional MRI apparatus is optimized in respect of the shielding effect by the shielding coil of the system. Consequently, the system generally is not optimized in respect of the Lorentz forces occurring in the system, resulting in noise of a level such that it is annoying to the users. In order to avoid such noise, the system can be force-optimized. Because the shielding effect is partly lost in that case, however, eddy currents and hence disturbing noise would occur again. However, if the eddy currents are made to occur in acoustically insulated eddy current conductors which also have a large time constant for the decay of the eddy currents, the adverse effects of these eddy currents are adequately counteracted and the disturbing noise is reduced to an adequate extent. Particularly, the (cold) radiation shields of a cryogenic magnet system, arranged in vacuum, can be used as eddy current conductors. The vacuum then constitutes the acoustic insulation.

16 Claims, 6 Drawing Sheets

MAGNETIC RESONANCE APPARATUS PROVIDED WITH FORCE-OPTIMIZED GRADIENT COILS

BACKGROUND OF THE INVENTION

1. Field of the Invention

The invention relates to a magnetic resonance apparatus which includes a coil system for generating a steady magnetic field in a measuring space of the apparatus, a gradient coil system which is arranged within the coil system for generating the steady magnetic field and serves to generate a magnetic gradient field in the measuring space of the apparatus, which gradient coil system includes an inner coil and an enclosing shielding coil for shielding the environment from the gradient field generated by the inner coil, which gradient coil system has been optimized so as to provide internal compensation of the Lorentz forces exerted on the turns of the gradient coil system by the steady magnetic field.

2. Description of Related Art

An apparatus of this kind is known from German patent No. 195 27 020 C1.

In order to optimize the shielding effect of the shielding coil of the gradient coil system, it is customary to proportion the shielding coil in a magnetic resonance apparatus in such a manner that the shielding effect of the shielding coil is maximum, given the limitations imposed by the apparatus design. However, as a consequence of the choice for this optimization, such a coil system is not optimized for the compensation of Lorentz forces acting on the coils, so that upon excitation such coils produce noise of a level which is usually annoying to the users.

The cited patent mentions that the ratio of the number of turns of the inner coil to that of the shielding coil of the gradient coil system can be chosen in such a manner that the gradient coil is optimized in respect of Lorentz forces. However, the cited document does not disclose any further steps for implementing this idea.

The effect of optimization of the gradient coil in respect of Lorentz forces is that the forces acting on the outer coil (the shielding coil) are equal and opposed to the forces acting on the inner coil. When these two coils are connected to a supporting member so as to form a rigid unit, as is customary, these forces compensate one another and, consequently, the mechanical vibrations produced by the gradient coil system will be considerably reduced, resulting in a substantial reduction of the annoying noise.

SUMMARY OF THE INVENTION

It is an object of the invention to provide a practical embodiment of a magnetic resonance apparatus of the kind set forth in which the gradient coil system is optimized in respect of noise production.

To this end, the magnetic resonance apparatus according to the invention is characterized in that: the apparatus is constructed so as to include at least one eddy current conductor which is arranged in the intermediate space between the coil system for generating the steady magnetic field and the gradient coil system, the apparatus includes means for acoustic insulation of the eddy current conductor, and the eddy current conductor is shaped in such a manner that its time constant for eddy currents is much greater than the pulse duration of the gradient pulses to be applied to the gradient coil system.

Because the gradient coil system is optimized with respect to the Lorentz forces exerted on the turns of the gradient coil system, the optimization with respect to the shielding effect of the shielding coil no longer exists. Consequently, the magnetic fields which now extend outside the gradient coil can generate eddy currents in electrically conductive parts in the vicinity (notably in parts of the apparatus itself), which eddy currents can still cause acoustic vibration of these parts and/or can disturb (as is known) the gradient field to be generated. Notably apparatus provided with a coil system for generating a steady magnetic field which is cooled to low temperatures includes radiation shields which are arranged around the coils in order to limit the transfer of heat by radiation, said radiation shields usually being made of an electrically conductive material so that they act as a eddy current conductor. In order to counteract the undesirable acoustic vibrations, therefore, according to the invention there is provided an eddy current conductor which is acoustically insulated from its environment. In order to counteract the undesirable magnetic influencing, the eddy current conductor is given a time constant which is much greater than the pulse duration of the gradient pulses. Even though the undesirable magnetic influencing by the eddy currents can be counteracted in a first approximation by appropriate proportioning of the gradient coil system and by imparting an "overshoot" to the gradient pulses, there still remains a temporal effect of the eddy currents that cannot be mitigated in this manner. The last step according to the invention enables a reduction of this temporal effect to a level which is acceptable in practice by making the variation in time of the eddy currents so small that, considered over the pulse duration of the gradient pulses, this variation is so small that it can be ignored. The associated temporal effects in that case do not occur to such an extent that they are noticeable.

An additional advantage of the use of the eddy current conductors in combination with optimization with respect to noise production resides in the fact that these eddy current conductors offer an energetic advantage for the generating of the gradient fields. Because force-optimized coil systems are actually overcompensated for magnetic fields, more energy is stored in such coil systems than in a shielding-optimized system. The eddy currents generated by this system, however, act in the same direction as the current in the primary coil of the system; therefore, they make a positive contribution to the gradient field to be generated. This means that the eddy currents make the gradient coil system more efficient to a given extent.

The coil system for generating a steady magnetic field in an embodiment of the apparatus according to the invention is constructed as a cryogenic coil system which is enclosed by a vacuum space, the eddy current conductor being formed by radiation shields which are arranged in the vacuum space so as to limit the transfer of heat by radiation, so that the means for acoustic insulation of the eddy current conductor are formed by the vacuum space surrounding the radiation shields.

As a result of these steps, advantage is taken of the electrically conductive radiation shields which are already present and now also serve as eddy current conductors. Because these shields are always arranged in vacuum, it is not objectionable that they are caused to vibrate, because the vacuum cannot transfer these vibrations to the environment, so that they do not cause noise. Moreover, the means for acoustic insulation, in this case being the vacuum, need not occupy a part of the measuring space which, in order to ensure that the apparatus does not become unnecessarily large, preferably always adjoins the inner wall of the surrounding coil system, as closely as possible.

The eddy current conductor in another embodiment of the apparatus according to the invention includes a plate-shaped shield, the means for acoustic insulation of the eddy current conductor being formed by an acoustic damping material which encloses the shield.

This embodiment of the invention can be used when the plate-shaped eddy current conductor is in acoustic contact with the environment. Any mechanical vibrations produced can be reduced to an acceptable level by these steps.

In another embodiment yet of the apparatus according to the invention, in which the eddy current conductor includes a plate-shaped shield, the means for acoustic insulation of the eddy current conductor are formed by flexible fastening means whereby the shield is attached to the apparatus.

This embodiment of the invention can also be used when the plate-shaped eddy current conductor is in acoustic contact with the environment. If the mechanical vibrations are transferred by the construction of the apparatus to a substantial degree, acoustic insulation of the eddy current conductor can be achieved by taking said steps. The latter steps can be combined with enclosure of the eddy current conductor by means of a damping material.

The eddy current conductor in another embodiment of the apparatus according to the invention includes a plate-shaped shield which is made of non-alloyed aluminium, the apparatus being provided with cooling means for cooling the shield to a temperature below 80 K.

It has been found that in this embodiment of the invention a time constant of the order of magnitude of 0.5 s can be achieved for the eddy current conductor; such a time constant is large in comparison with the pulse duration of the gradient pulses which is of the order of magnitude of 10 ms. Moreover, this embodiment offers the advantage that only a small amount of heat is developed in the plate-shaped shield by the eddy currents.

The eddy current conductor in a further embodiment yet of the apparatus according to the invention includes a plate-shaped shield in the superconducting state.

This embodiment of the invention is particularly suitable for apparatus which already include a cryogenic installation for cooling the coils for generating the steady magnetic field. A time constant which is sufficiently large relative to the pulse duration of the gradient pulses can thus also be imparted to the eddy current conductor.

In another embodiment of the apparatus according to the invention, the steady magnetic field has an axis of rotational symmetry and the eddy current conductor comprises an eddy current coil system whose turns are situated at least partly in planes extending transversely of said symmetry axis.

This embodiment of the invention is particularly suitable for compensating, in a specified manner, the magnetic field which extends outside the gradient coil system, said compensation concerning notably the spatial distribution. The eddy current coil system in this embodiment can be adapted to the type of gradient coils whose magnetic field is to be compensated. The gradient coil which extends perpendicularly to the symmetry axis (the so-called z coil) is situated practically completely in a plane extending transversely of the symmetry axis; in order to compensate the magnetic field of this coil, therefore, it will be desirable to arrange the eddy current coil also in such a transverse plane. The other gradient coils (the x coil and the y coil) have turns with arc-shaped parts which are situated in a plane transversely of the symmetry axis. These parts are exactly the parts on which a Lorentz force is exerted; in order to compensate the magnetic field of such coils, therefore, it will be desirable to provide an eddy current coil having parts extending in such a transverse plane.

A further embodiment of the apparatus according to the invention is provided with power supply means for controlling the eddy current coil system independently of the control of the gradient coil system.

Because of the independent control of the eddy current coil system, this embodiment is particularly suitable for compensating, in a specified manner, the magnetic field extending outside the gradient coil system, which compensation takes place notably in a time-dependent sense. A major part of the compensation of the magnetic field to be compensated will already be provided by eddy currents. These eddy currents, however, are dependent on time. They decay during the gradient pulses. The variation of the eddy current after termination of the gradient pulse is also undesirable, because it simulates a tail of the gradient pulse which has an adverse effect on the original, desired shape of this pulse. The time-dependent nature of the eddy currents disturbs the desired field to be generated by the gradient coils. Compensation in this respect cannot be achieved by way of proportioning of the shielding coils and/or the eddy current conductors. If the decay during the gradient pulses is so large that a disturbance occurs that cannot be ignored, this decay can be compensated by means of said independent control. The time constant for the decay can thus be made arbitrarily large, and hence the disturbance arbitrarily small.

The number of turns of the eddy current coil system in a further embodiment of the apparatus according to the invention is greater than the number of turns of the shielding coil.

In the case of a constant number of ampere turns in the eddy current coil system, a small current can be made to suffice in these turns by selection of a large number of turns. It can thus be ensured that the amount of power dissipated in the drive amplifiers is small. Moreover, this embodiment offers advantages when the eddy current coil system is at a very low temperature, as is the case for a superconducting eddy current coil system. In that case the supply conductors to and from the system may be thin, so that serious heat leakage is prevented.

The eddy current coil system in a further embodiment of the apparatus according to the invention includes turns which are closed in themselves.

In situations in which it is not critical to compensate the magnetic field outside the gradient coil system in a time-dependent sense, this step according to the invention suffices; it offers the advantage that active control of the eddy current coil system can be dispensed with, because the behavior of this system is now similar to that of the plate-shaped eddy current conductor. The designer is free to control a part of the turns actively, if desired, and to close other turns in themselves.

The turns in another embodiment of the apparatus according to the invention are superconducting.

This embodiment of the invention is particularly suitable for apparatus which already include a cryogenic installation for cooling the coils for generating the steady magnetic field. Thus, the eddy current conductor can be given a time constant which is sufficiently long relative to the pulse duration of the gradient pulses.

BRIEF DESCRIPTION OF THE DRAWING

The invention will be described in detail hereinafter with reference to the Figures in which corresponding reference numerals denote corresponding elements. Therein.

DETAILED DESCRIPTION OF THE PREFERRED EMBODIMENT

Figure 1:
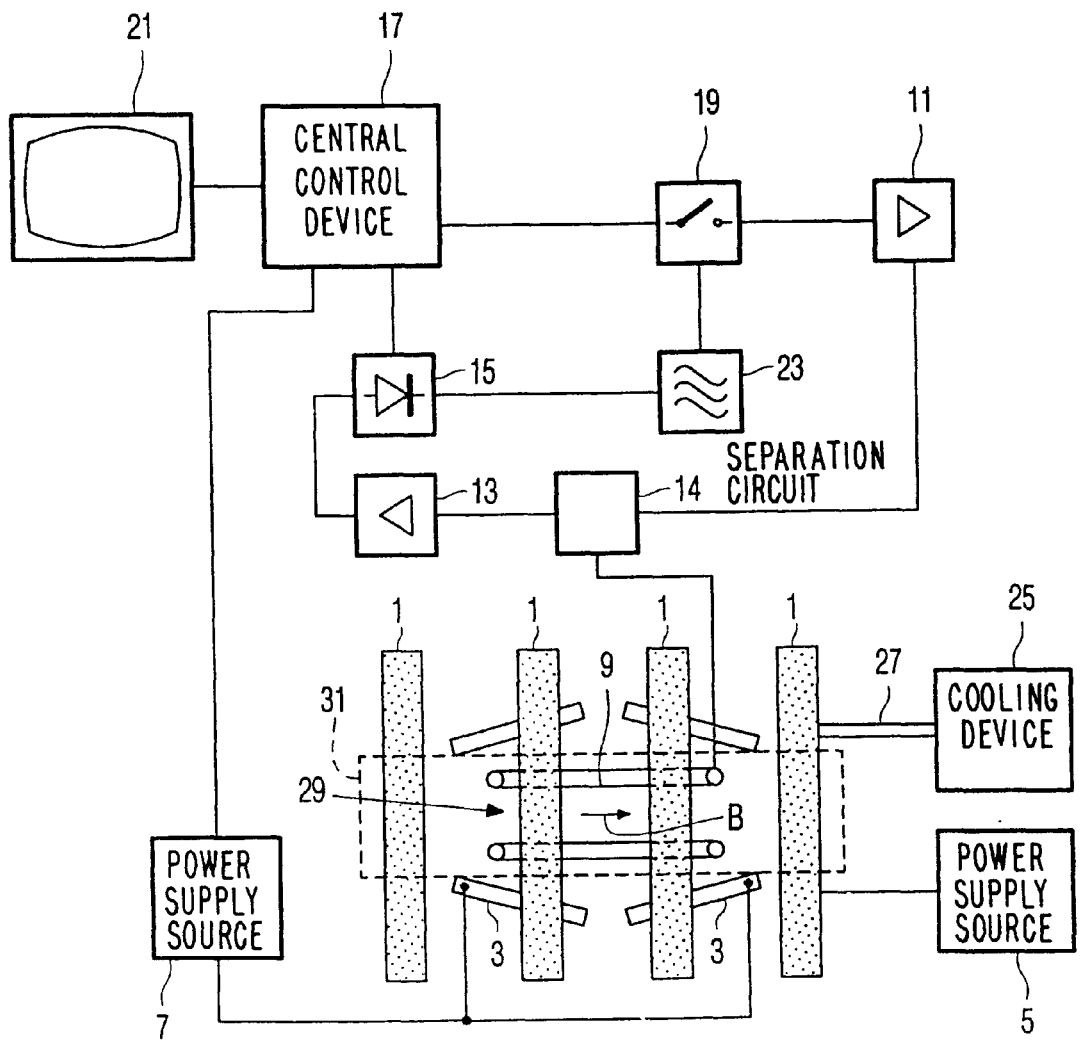
FIG. 1 shows diagrammatically the general construction of a magnetic resonance apparatus.

The magnetic resonance apparatus which is diagrammatically shown in FIG. 1 includes a first magnet system 1 for generating a steady magnetic field B, a second magnet system 3 for generating magnetic gradient fields, and a power supply source 7 for the second magnet system 3 and a power supply source 5 for the first magnet system 1. An RF coil 9 serves to generate an RF magnetic alternating field; to this end it is connected to an RF transmitter device which includes an RF source 11. The RF coil 9 can also be used for the detection of the spin resonance signals generated by the RF transmitted field in an object to be examined (not shown); for this purpose, this coil is connected to an RF receiving device which includes a signal amplifier 13. The output of the signal amplifier 13 is connected to a detector circuit 15 which is connected to a central control device 17. The central control device 17 also controls a modulator 19 for the RF source 11, the power supply source 7 and a monitor 21 for image display. An RF oscillator 23 controls the modulator 19 as well as the detector 15 processing the measuring signals. A cooling device 25, including cooling ducts 27, serves to cool the magnet coils of the first magnet system 1. The RF coils 9, arranged within the magnet systems 1 and 3, encloses a measuring space 29 which, in an apparatus for medical diagnostic measurements, is large enough to accommodate a patient to be examined or a part of a patient to be examined, for example the head and the neck. A steady magnetic field B, gradient fields for selecting object slices and a spatially uniform RF alternating field can thus be generated in the measuring space 29. The RF coil 9 may combine the functions of transmitter coil and measuring coil in which case a separation circuit 14 is provided for separating the incoming and outgoing signal traffic. It is alternatively possible to use different coils for these two functions, for example surface coils as measuring coils. If desired, the coil 9 may be enclosed by a Faraday cage 31 shielding RF fields.

Figure 2:
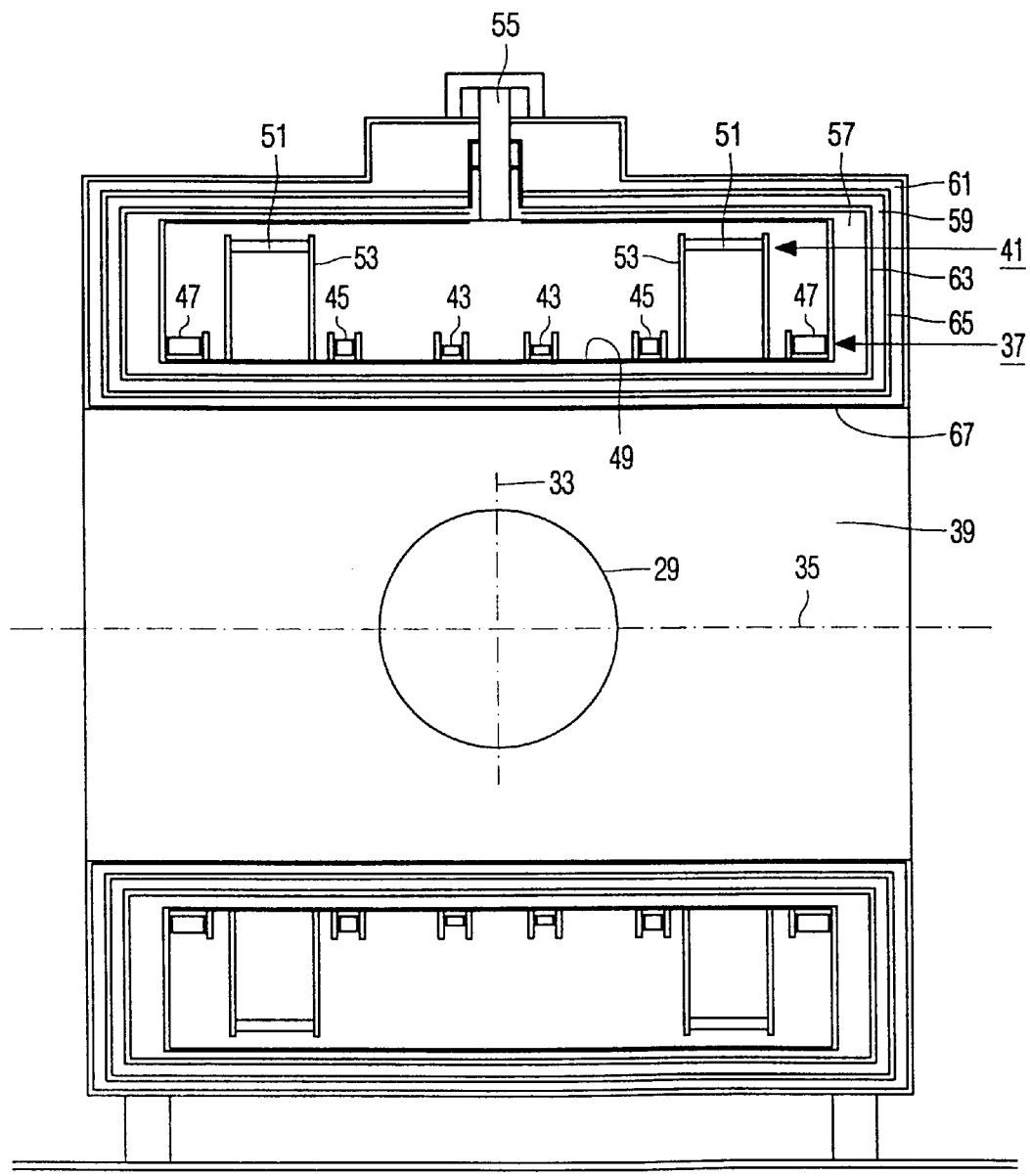
FIG. 2 is a longitudinal sectional view of a coil system for generating a steady magnetic field in a measuring space of the apparatus, which coil system can be used in a magnetic resonance apparatus according to the invention.

The magnet system shown in FIG. 2 may form part of the magnetic resonance apparatus described with reference to FIG. 1. The magnet system (denoted by the reference numeral 1 in FIG. 1) is shown in FIG. 2 in a cross-sectional view taken in a plane through the symmetry axis of an approximately cylindrical coil system. The magnet system shown includes an approximately cylindrical electromagnetic inner coil system 37 which encloses a likewise approximately cylindrical receiving space 39, an approximately spherical central part of which serves as a measuring space 29. The receiving space 39, for example having a diameter of 100 cm, can receive a patient (not shown) in such a manner that a part of the body of the patient to be examined is situated in the measuring space 29 which has a diameter of, for example approximately 45 cm. The inner coil system 37 serves to generate a substantially uniform steady magnetic field in the measuring space 29. The inner coil system 37 is concentrically enclosed by an approximately cylindrical outer coil system 41. The two coil systems 37, 41 and the receiving space 39 are rotationally symmetrically situated relative to a central axis 35 (denoted by a dash-dot line) and are in many cases (but not necessarily so) symmetrically situated relative to a central plane which extends perpendicularly to the central axis and is denoted by a dash-dot line 33.

The inner coil system 37 of the present embodiment includes a pair of inner coils 43, a pair of central coils 45 and a pair of outer coils 47. Said coil pairs 43, 45 and 47 are symmetrically arranged relative to the symmetry plane 33; this means that the coils of the same pair which are situated to both sides of the symmetry plane have the same numbers of turns and are a mirror image of one another in respect of shape and distribution of the turns. The coils 43, 45 and 47 of the inner coil system 37 are provided on an inner wall of a helium vessel 49 which also serves as a common support. The outer coil system 41 includes a pair of coils 51 which are also symmetrically situated relative to the symmetry plane 33. The coils 51 of the outer coil system 41 are also arranged within the helium vessel 49, each coil being provided on a respective support 53. The coils 51 of the outer coil system 41 act as a shield for the magnetic field generated outside the magnet system 1 by the inner coil system 37.

The two coil systems 37 and 41 are accommodated in the helium vessel 49 which can be filled with a suitable cooling liquid, for example liquid helium, via a filling opening 55. The coils constituting the coil systems 37 and 41 are made of a material which is superconducting at the temperature of the cooling liquid.

The content of the helium vessel 49 is subject to atmospheric pressure or a slight overpressure; the adjoining spaces 57, 59 and 61 have been evacuated and the totality of these spaces, therefore, is referred to as the vacuum space. Between the spaces 57 and 59 as well as between the spaces 59 and 61 there is arranged a radiation shield 63, 65, respectively, which serves to limit the transfer of heat by radiation. These radiation shields are usually made of an electrically conductive material and hence can also act as an eddy current conductor. During operation the radiation shield 63 is maintained at a temperature of approximately from 12 to 16 K and the radiation shield 65 is maintained at a temperature of approximately 60 K. The radiation shields 63 and 65 and the vacuum spaces 57 and 59 are situated within a vacuum vessel 67.

When the gradient coil system has been optimized in respect of Lorentz forces, eddy currents are induced in the radiation shields 63 and 65 which also act as eddy current conductors, that is to say if the wall of the vacuum vessel 67 which adjoins the receiving space 39 is transparent to eddy currents as it is assumed to be in this case. Because the radiation shields are arranged in a vacuum environment, acoustic vibrations cannot be transferred by a surrounding atmosphere. The surrounding vacuum thus acts as a means for acoustic insulation of the eddy current conductor. Not only the radiation shields can act as eddy current conductors, but all plate-shaped or coil-shaped conductors present in the intermediate space between the coil system for generating the steady magnetic field and the gradient coil system can in principle act as such. Examples in this respect are an electrically conductive wall of the steady coil system or conductors which are arranged especially for this purpose in said intermediate space. In that case the eddy current conductor may be enclosed by an acoustic damping material such as a powdery or granular material, for example sand. It is alternatively possible to attach the eddy current conductor flexibly or resiliently to its environment, in combination with the damping material or not. This is possible notably in the case involving the electrically conductive wall of the steady coil system, which wall is then attached to the appropriate flanges via flexible or resilient supports instead of being welded thereto. The means for acoustic insulation of the eddy current conductor are then formed by said flexible or resilient fastening means.

Figure 3:
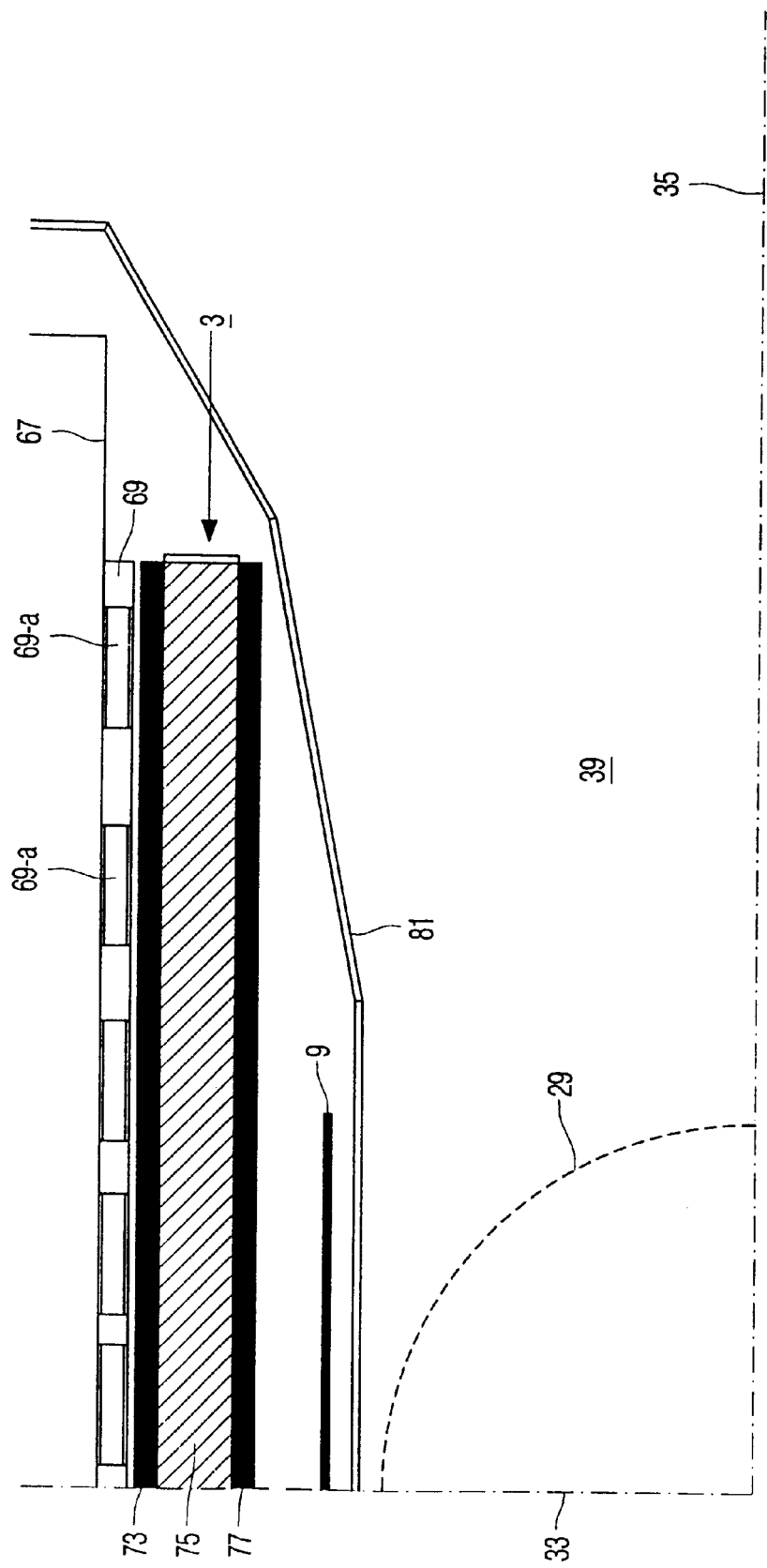
FIG. 3 is a partial longitudinal sectional view of a coil system for generating a gradient field in a measuring space of the apparatus, which coil system can be used in a magnetic resonance apparatus according to the invention.

FIG. 3 is a partial longitudinal sectional view of a coil system for generating a gradient field in a measuring space of the magnetic resonance apparatus according to the invention. FIG. 3 shows this coil system (denoted by the reference numeral 3 in FIG. 1) as a cross-sectional view in a plane through the symmetry axis 35 of the system. Moreover, because of the symmetry of the coil system 3 relative to the central plane 33, only the part to the right of the central plane 33 is shown, be it only the upper part thereof (because of the symmetry relative to the axis 35). The coil system shown can serve to generate x, y as well as z gradient fields. The shape of the x and y coils (saddle shape) deviates from that of the z coil (cylindrical shape), but that is not essential to the representation in FIG. 3.

The coil system shown in FIG. 3 is situated completely between the receiving space 39 and the inner wall of the vacuum vessel 67. FIG. 3 shows a part of the inner wall of the vacuum vessel 67. The gradient coil system 3 and the RF coil system 9 are arranged in this intermediate space; they are enclosed by a cover 81.

The gradient coil system 3 consists of a support 75 of a synthetic material (fiberglass-reinforced epoxy), on the inner side of which the primary gradient coils 77 are provided whereas the shielding coils 73 are provided on its outer side. The assembly thus formed is constructed as a mechanically rigid unit. A number of from 24 to 36 rails 69, provided with pieces of shim iron 69-a, is arranged between the inner wall of the vacuum vessel 67 and the gradient coil system 3. The rails provided with iron serve to achieve further homogenization of the steady field; they are not of essential importance to the invention. FIG. 3 also shows a part of the measuring space 29 situated around the axis 35.

FIG. 4 shows diagrammatically some types of distortion that may occur in gradient coil system which has not been optimized so as to compensate Lorentz forces. The FIGS. 4a and 4b concern distortions of a saddle-shaped coil as used for generating gradient fields in the x and y directions, and the FIGS. 4c and 4d relate to distortions of a round coil as used to generate gradient fields in the z direction.

Figure 4A:
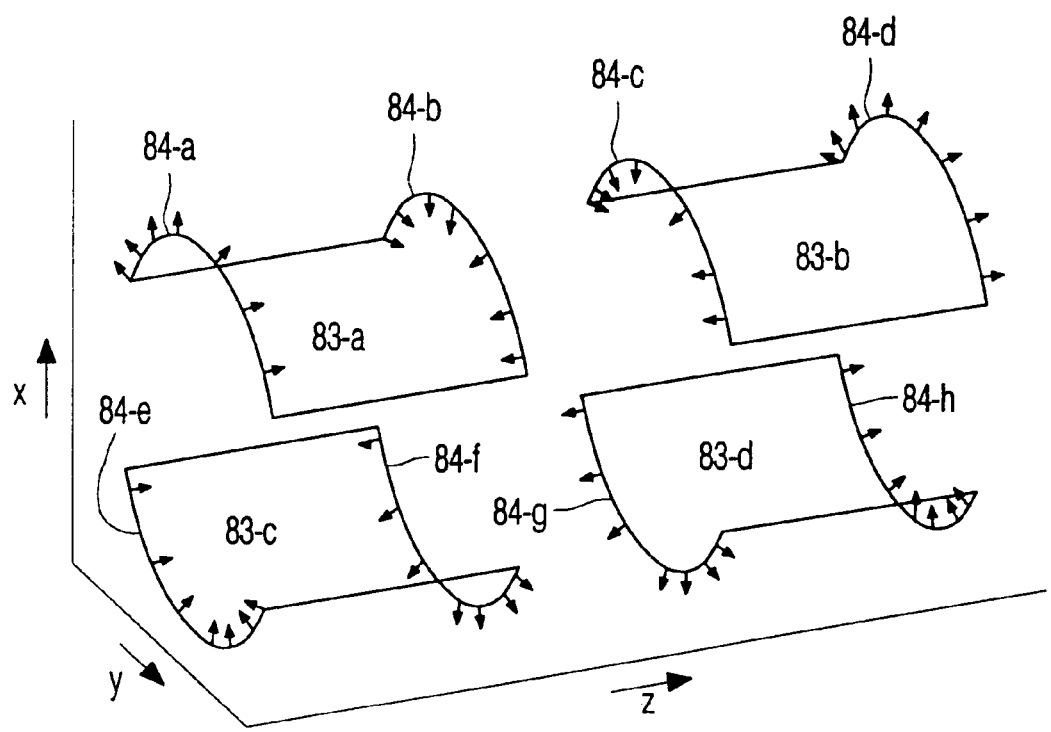
FIG. 4 shows some diagrammatic representations of the distortions that may occur in a gradient coil system which has not been optimized so as to compensate Lorentz forces.

FIG. 4a shows four saddle-shaped coils 83-a to 83-d. The four coils constitute the primary coils of the gradient coil system for one co-ordinate direction, for example the x direction: The Figure does not show the shielding coils of this system; opposing forces are generated in these shielding coils, but since it is assumed for FIG. 4 that the system constitutes a gradient coil system which has not been force-optimized, the forces shown may also be considered as the forces resulting from the combination of the primary coils and the shielding coils. The Lorentz forces caused by the steady magnetic field in the z direction act only on parts of the conductors which are not oriented parallel to said field. These are the arc-shaped parts 84-a to 84-h of the saddle coils in FIG. 4a. For a given direction of the steady magnetic field and the current through the saddle coils, Lorentz forces occur as denoted by the directions of the arrows in the Figure. It is assumed that these coils are arranged on a cylindrical support which is not shown in FIG. 4a.

Figure 4B:
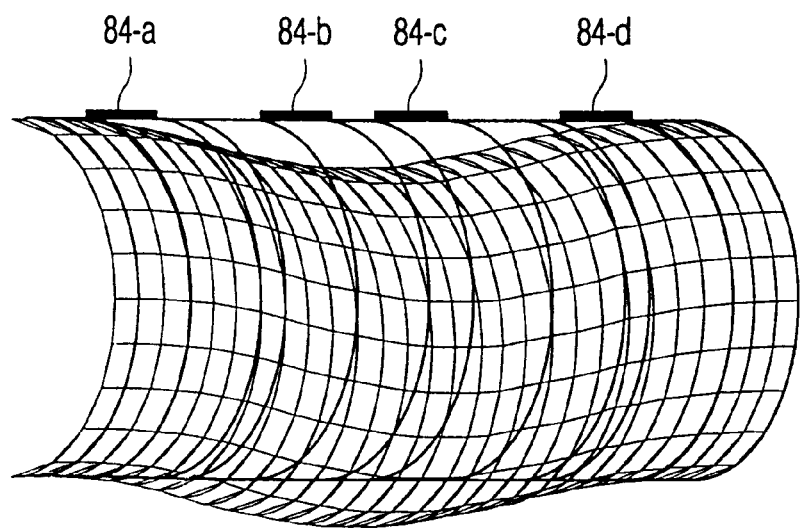

FIG. 4b shows, at a greatly enlarged scale, the distortions which occur in the cylindrical support, it being assumed that the support was rigidly clamped in two planes, i.e. one plane with a z co-ordinate sightly to the left of the arc-shaped conductors 84-h and 84-e and another plane with a z co-ordinate slightly to the right of the arc-shaped conductors 84-d and 84-h. FIG. 4b shows only the side of the cylinder which faces the positive y direction. It is also assumed that the arc-shaped conductors have a given width in the z direction. The positions of the arc-shaped conductors 84-a to 84-d are indicated at the top of the cylinder. FIG. 4b clearly shows the distortion due to the Lorentz forces. When the currents change, as is always the case for the currents flowing through the gradient coils, the forces also change and the distortion changes, thus causing the acoustic vibrations.

Figure 4C:
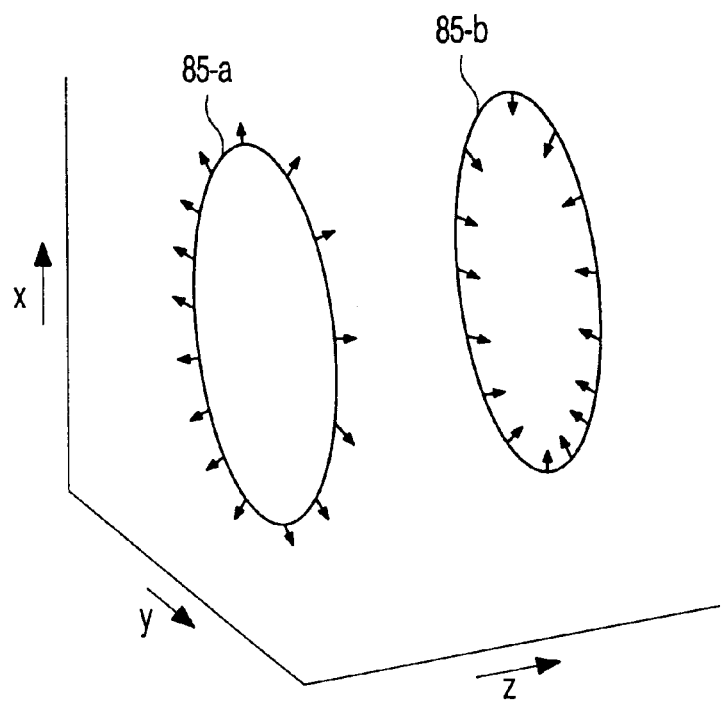
Figure 4D:
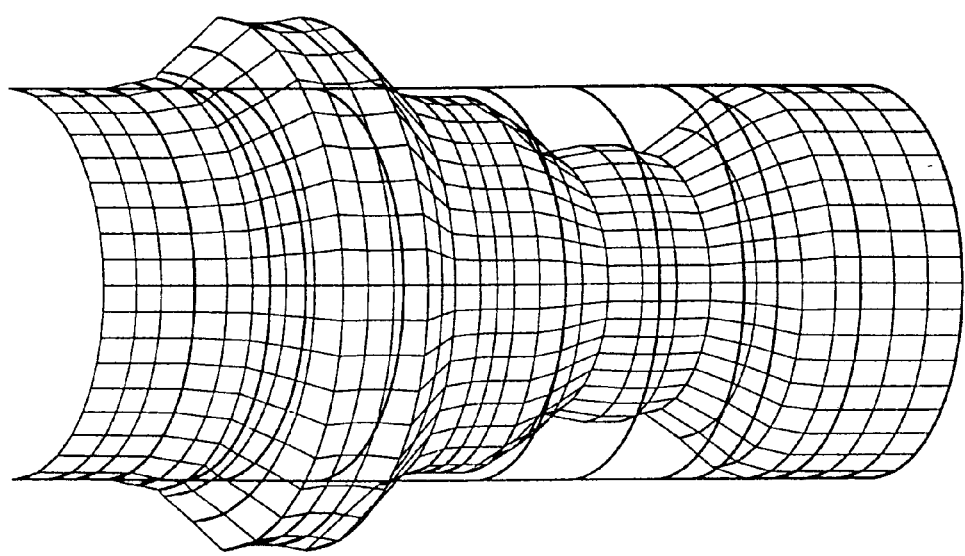

FIG. 4c shows two round coils 85-a and 85-b, both being primary coils of a gradient coil system. This Figure does not show the shielding coils of the system either. The Lorentz forces act on the entire conductors in this Figure. The Lorentz forces occurring are again denoted by arrows in the Figure. It is also assumed again that the coils 85-a and 85-b are provided on a cylindrical support which is not shown in FIG. 4c. FIG. 4d shows, at a greatly enlarged scale, the distortions which occur in this cylindrical support, it being assumed that the support was rigidly clamped in two planes, i.e. one plane with a z coordinate slightly to the left of the conductor 85-a and another plane with a z co-ordinate slightly to the right of the conductor 85-b. FIG. 4d shows only the side of the cylinder which faces the positive y direction. It is also assumed that the conductors 85-a and 85-b have a given width in the z direction. The positions of these conductors in the Figure can be recognized on the basis of the widening and narrowing of the cylinder. This Figure again clearly shows the distortions caused by the Lorentz forces; the same acoustic effect occurs as in the case of FIG. 4b.

In order to avoid to above undesirable distortions of the gradient coil system, this system is optimized so as to provide internal compensation of Lorentz forces exerted on the turns of the gradient coil system by the steady magnetic field. This force optimization can be realized in various ways. Force optimization is based on the fact that for a small area having a given z co-ordinate the Lorentz forces exerted on the gradient coils are equal and opposed, to the Lorentz forces exerted on the shielding coils and having the same z co-ordinate. If the magnitude and the direction of the steady magnetic field at the area of the primary coils and at the area of the shielding coils of the gradient coil system are known, these forces can be calculated for a given number of ampere turns in said area. For a given number of ampere turns in the primary coil, this calculation yields the number of ampere turns required in the shielding coil. Variation of the radius of the shielding coil also offers a design degree of freedom for design, because a different value of the steady field can be chosen because of such a variation.

It has already been described with reference to FIG. 2 that the radiation shields 63 and 65 can act as eddy current conductors. However, the eddy current conductors can also be constructed in the form of an eddy current coil system, i.e. a system comprising coil-shaped conductors. These conductors can be provided at the location of the radiation shields or in the helium vessel (in which case the coil-shaped conductors may be superconducting) or in the space between the helium vessel and the gradient coil system. The shape of the coils is determined by the shape of the coils wherefrom the fields causing the eddy currents originate. The eddy current conductors associated with the x and y gradient coils (so the saddle-shaped coils) also consist of saddle-shaped coils which are situated beyond the gradient coils, viewed from the symmetry axis, but generally are not rotated about the symmetry axis with respect thereto, or only hardly so. The eddy current conductors associated with the z gradient coils (so the round coils) also consist of round coils which have a diameter which is larger than that of the gradient coils. These coils may be closed in themselves (notably in the case of the superconducting version), but can also be controlled by amplifiers in such a manner that the decrease in time of the current intensity of the induced eddy currents is compensated by the current supplied by the amplifiers. A virtual time constant of arbitrary magnitude can thus be obtained. Because these amplifiers need only supplement the (generally small) decrease of the eddy currents, they need only be proportioned for a small power and also only for small currents in the case of a large number of turns of the eddy current conductors.

Figure 5A:
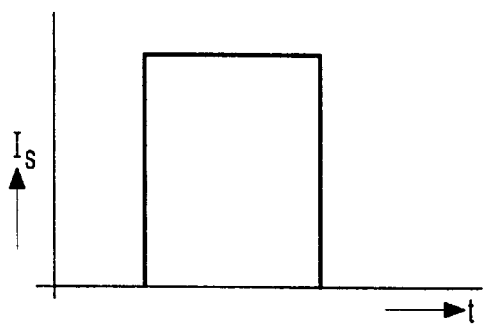
FIG. 5 shows the signal waveforms for some situations in a gradient coil system which has been optimized in respect of Lorentz forces and in an associated eddy current conductor which is constructed as a coil.
Figure 5D:
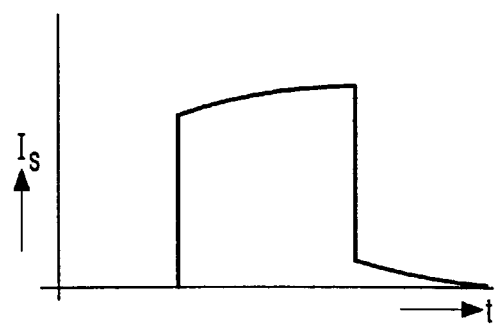
Figure 5B:
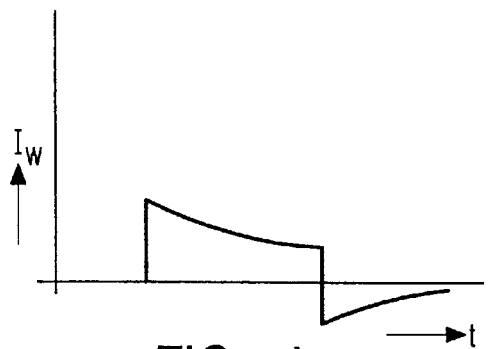
Figure 5E:
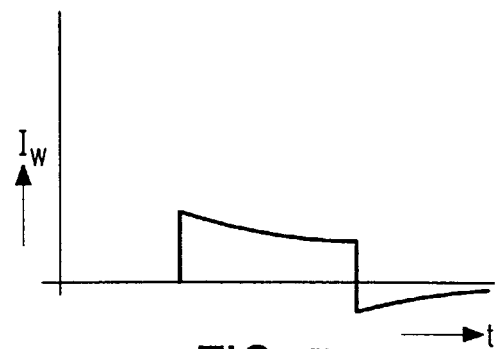
Figure 5C:
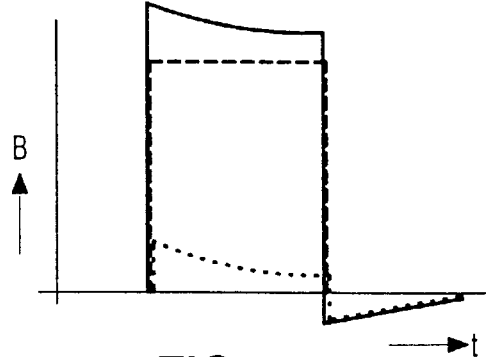
Figure 5F:
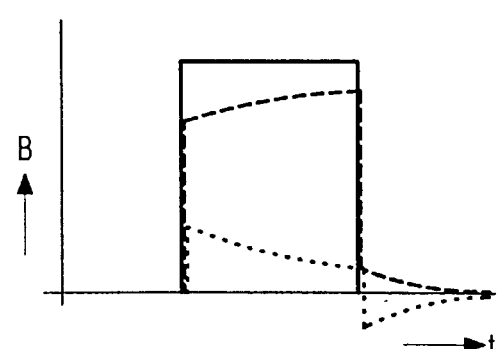

FIGS. 5a and 5d show the variation of the currents Is through the primary coils of the gradient coil system; FIGS. 5b and 5e show the variation of the currents $I_w$ through an eddy current conductor which is constructed as a coil, and FIGS. 5c and 5f show the variation of the gradient field B caused by said two currents. For the sake of clarity of the effects occurring in all these Figures it is assumed that the time constant for eddy currents is of the same order of magnitude as the pulse duration of the gradient pulses to be applied to the gradient coil system; however, in practice this will not be the case, because the aim is to reach a situation in which the time constant for eddy currents is much greater than the pulse duration of the gradient pulses.

FIG. 5a shows the variation of the current through the primary coil (and hence also through the shielding coil if the latter is connected in series therewith) of the gradient coil system as a function of time. The current shown is a direct current having a pulse duration of the order of magnitude of 10 ms. For the sake of clarity of the Figure it does not show the rise time and the decay time of the pulse. Actually, this purely square-wave variation of the gradient pulse represents the desired variation of the gradient field. FIG. 5b shows the variation in time of the current through an eddy current conductor which is constructed as a coil which is short-circuited in itself. This Figure may also be considered to show the variation of the current density in a plate-shaped eddy current conductor. This current is thus induced in the eddy current conductor by the current shown in FIG. 5a. In this respect it is assumed that no active control of the eddy current conductor takes place in this Figure. The variation of the field geometry of the gradient field due to the currents shown in the FIGS. 5a and 5b is shown in FIG. 5c. In this Figure the variation according to FIG. 5a is denoted by a dashed line and the variation according to FIG. 5b by a dotted line, and the resultant field (the sum of the latter two) is represented by a solid line. The latter line, therefore, represents the actual variation of the gradient field, it being clearly shown that initially the gradient field generated by the eddy currents would be much too strong and that after termination of the gradient pulse an oppositely directed gradient field would remain due to the eddy current. Evidently, both these effects are undesirable.

FIG. 5d again shows the variation of the current through the primary coil of the gradient coil system as a function of time, but in this case the effect of the current through the eddy current conductor has already been taken into account for the shape of the current pulse. A compensation has already been made in the current variation for the expected contribution to the gradient field by the eddy current. Therefore, the current pulse starts at a value which is lower than in FIG. 5a and it gradually increases; thus its variation is approximately opposite to that in FIG. 5b. Upon termination of the current pulse, a residual current remains which serves as a compensation for the eddy current. FIG. 5e shows, as a function of a time, the variation of the eddy current induced by the current variation according to FIG. 5d. The variation of this current is approximately the same as that in FIG. 5b, but lies slightly lower because the current of FIG. 5d is also slightly lower than that in FIG. 5a. It is again assumed that no active control of the eddy current conductor takes place in this Figure. The variation of the field shape of the gradient field resulting from the currents of the FIGS. 5d and 5e is shown in FIG. 5f. In this Figure the variation according to FIG. 5d is represented by a dashed line, the variation according to FIG. 5e is represented by a dotted line and the resultant field (the sum of the latter two) is represented by a solid line.

The latter line thus represents the actual variation of the gradient field. This actual variation of the gradient field clearly shows that, due to the compensation in the pulse shape according to FIG. 5d, the gradient field generated now has the desired shape of a square-wave pulse.

Figure 5G:
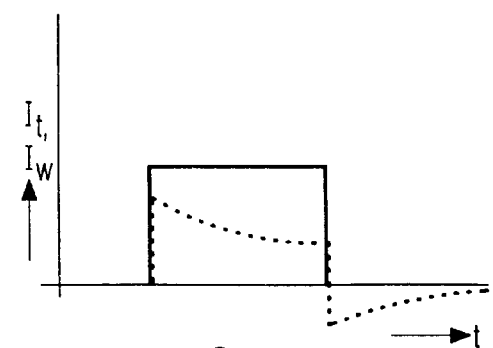
Figure 5H:
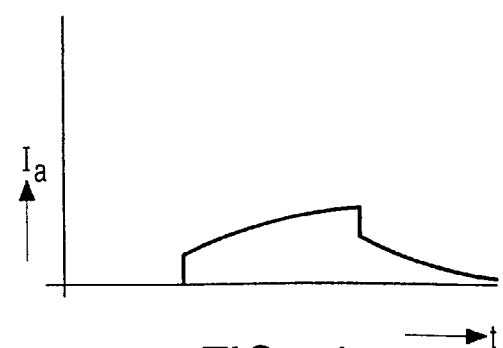

The procedure described above with reference to the FIGS. 5a to 5f is known per se for the adaptation of the gradient pulse to the disturbing effect of the eddy currents. However, using this method the disturbing effect of the eddy currents can be compensated in only one point in space. If the time dependency of the eddy currents, however, could be eliminated, or if the same time dependency could be achieved throughout space, the disturbing effect of the eddy currents could in principle be eliminated for the entire space of interest. This can be achieved according to the invention by providing an eddy current conductor which is constructed as an actively controllable current coil system. The desired effect of absence of time dependency can then be achieved by injecting such an additional current $I_a$ into the eddy current coil system that the variation of the overall current $I_t$ in this conductor as a function of time has the same appearance as in FIG. 5a, i.e. a square-wave variation. In FIG. 5g this variation of $I_t$ is represented by a solid line, together with the variation of the induced eddy current $I_w$ according to FIG. 5b which is represented by a dashed line. These two curves clearly show that the additional current $I_a$ to be supplied by the power supply means for controlling the eddy current coil system should vary as the difference between these two curves. This variation is shown in FIG. 5h.

All references cited herein are incorporated herein by reference i their entirety and for all purposes to the same extent as if each individual publication or patent or patent application was specifically and individually indicated to be incorporated by reference in its entirety for all purposes.

What is claimed is:

1. A magnetic resonance apparatus comprising:

a coil system for generating a steady magnetic field in a measuring space of the apparatus, a gradient coil system which is arranged within the coil system for generating the steady magnetic field and serves to generate a magnetic gradient field in the measuring space of the apparatus, the gradient coil system including an inner coil and an enclosing shielding coil for shielding the environment from the gradient field generated by the inner coil, and the gradient coil system being optimized so as to provide internal compensation of Lorentz forces exerted on the turns of the gradient coil system by the steady magnetic field, at least one eddy current conductor which is arranged in intermediate space between the coil system for generating the steady magnetic field and the gradient coil system, the at least one eddy current conductor having a time constant for eddy currents greater than the pulse duration of the gradient pulses to be applied to the gradient coil system, and means for acoustic insulation of the at least one eddy current conductor.

2. A magnetic resonance apparatus as claimed in claim 1, wherein the coil system for generating a steady magnetic field is constructed as a cryogenic coil system which is enclosed by a vacuum space, and wherein the at least one eddy current conductor is formed by radiation shields which are arranged in the vacuum space so as to limit the transfer of heat by radiation, so that the means for acoustic insulation of the at least one eddy current conductor are formed by the vacuum space surrounding the radiation shields.

3. A magnetic resonance apparatus as claimed in claim 1, wherein the at least one eddy current conductor includes a plate-shaped shield in which the means for acoustic insulation of the at least one eddy current conductor are formed by the acoustic damping material which encloses the shield.

4. A magnetic resonance apparatus as claimed in claim 1, wherein the at least one eddy current conductor includes a plate-shaped shield and in which the means for acoustic insulation of the at least one eddy current conductor are formed by flexible fastening means whereby the shield is attached to the apparatus.

5. A magnetic resonance apparatus as claimed in claim 1, wherein the at least one eddy current conductor includes a plate-shaped shield which is made of non-alloyed aluminium, and the apparatus further comprises cooling means for cooling the shield to a temperature below 80 K.

6. The magnetic resonance apparatus of claim 5, wherein the steady magnetic field has an axis of rotational symmetry, and wherein the at least one eddy current conductor comprises an eddy current coil system whose turns are situated at least partly in planes extending transversely to said symmetry axis.

7. The magnetic resonance apparatus of claim 6 further comprising power supply means for controlling the eddy current coil system independently of the control of the gradient coil system.

8. The magnetic resonance apparatus of claim 7 wherein the number of turns of the eddy current coil system is greater than the number of turns of the shielding coil.

9. The magnetic resonance apparatus of claim 6 wherein the eddy current coil system includes closed turns.

10. The magnetic resonance apparatus of claim 9 wherein the closed turns are superconducting.

11. A magnetic resonance apparatus as claimed in claim 1, wherein the at least one eddy current conductor includes a plate-shaped shield in the superconducting state.

12. A magnetic resonance apparatus as claimed in claim 1 wherein the steady magnetic field has an axis of rotational symmetry and wherein the at least one eddy current conductor comprises an eddy current coil system whose turns are situated at least partly in planes extending transversely to said symmetry axis.

13. A magnetic resonance apparatus as claimed in claim 12, wherein the eddy current coil system includes closed turns.

14. A magnetic resonance apparatus as claimed in claim 13, wherein the closed turns are superconducting.

15. A magnetic resonance apparatus as claimed in claim 7 further comprising power supply means for controlling the eddy current coil system independently of the control of the gradient coil system.

16. A magnetic resonance apparatus as claimed in claim 15, wherein the number of turns of the eddy current coil system is greater than the number of turns of the shielding coil.

* * * * *